(12) United States Patent
Fan

(10) Patent No.: US 7,837,478 B2
(45) Date of Patent: Nov. 23, 2010

(54) ELECTRCAL CONNECTOR WITH DETACHABLE ALIGNING KEY

(75) Inventor: Chia-Wei Fan, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/481,602

(22) Filed: Jun. 10, 2009

(65) Prior Publication Data

US 2009/0305529 A1  Dec. 10, 2009

(51) Int. Cl.
*H01R 12/00* (2006.01)
(52) U.S. Cl. ............... 439/71; 439/681; 439/526
(58) Field of Classification Search ............ 439/71, 439/681, 526
See application file for complete search history.

(56) References Cited

U.S. PATENT DOCUMENTS

| | | | |
|---|---|---|---|
| 6,702,588 B1 * | 3/2004 | McHugh et al. ............... 439/71 |
| 7,207,808 B2 | 4/2007 | Ma | |
| 7,361,028 B1 * | 4/2008 | Polnyl .......................... 439/68 |
| 7,367,822 B2 * | 5/2008 | Ma .............................. 439/135 |
| 7,534,133 B2 * | 5/2009 | Hamner ....................... 439/526 |
| 7,547,216 B1 * | 6/2009 | Polnyl et al. .................. 439/68 |
| 7,654,830 B2 * | 2/2010 | Lin .............................. 439/71 |

\* cited by examiner

*Primary Examiner*—Gary F. Paumen
(74) *Attorney, Agent, or Firm*—Andrew C. Cheng; Wei Te Chung; Ming Chieh Chang

(57) ABSTRACT

An electrical socket connector (100) includes an insulative housing (1) having a general flat base (11) with a mating surface (11a) adapted to face a chip package (3), and a mounting surface (11b) adapted to face a printed circuit board. The base includes a peripheral wall (102) extending from edges thereof. A plurality of passageways (12) extends from the mating interface toward the mounting interface, with a plurality of terminals each inserted into the passageways from the mating interface to the mounting interface. A detachable aligning key (2) is assembled to the insulative housing.

13 Claims, 4 Drawing Sheets

ELECTRCAL CONNECTOR WITH DETACHABLE ALIGNING KEY

BACKGROUND OF THE INVENTION

1. Field of the Invention

The present invention relates to an electrical socket connector, and more particularly to an electrical socket connector having a detachable aligning key.

2. Description of Prior Arts

LGA socket connector is an interface between a central processing unit (CPU) chip and a motherboard of a computer. The existing LGA socket connector generally includes a flat base having a mating interface and a mounting interface. The base further includes a peripheral wall so as to jointly define a receiving space together with the base for receiving the CPU chip therein. A plurality of passageways extends from the mating interface toward the mounting interface. Each of the passageways is mounted with a terminal. However, orientation is always an issue for electronic devices. There is no exception for CPU. Each contacting pads under the CPU is assigned to a pre-determined function. Incorrectly mounting the CPU onto the socket connector will not only render the CPU useless, but also will possible damage the socket connector. In order to ensure the CPU is correctly placed onto the socket connector, and make the CPU correctly function, the CPU chip is provided with a pair of notches along sides of the CPU chip. Meanwhile, the socket connector is also provided with a pair of aligning keys corresponding to those two notches. As such, when the notches and the aligning keys are correctly matched, it can be ensured that the CPU is correctly mounted onto the mating interface of the socket connector. In the existing socket connector, the aligning keys are arranged on side wall of the housing to match the notches of the CPU, they can not be moved, and the aligning keys of the housing can only match one type of CPU. There are a lot of types of CPUs used in the different types of computer, and the notches are defined at different positions in different types of CPU. That is, the LGA socket connector should be designed in different types to match the CPUs, and every type of the LGA socket connector needs a mold, so cost of the connector will soar. And out customer may not accept the high price of connector.

Therefore, it is desirable to provide a new electrical connector that decreases the cost of the connector.

SUMMARY OF THE INVENTION

Accordingly, an object of the present invention is to provide an LGA electrical connector to match at least two types of CPU.

In order to achieve afore-mentioned object, An electrical connector comprising an insulative housing, a plurality of terminals and a detachable aligning key. The insulative housing having a general flat base and a peripheral wall extending from edges of the base. The base defines a mating interface adapted to face a chip package, and a mounting interface adapted to face a printed circuit board. A plurality of passageways extend from the top interface toward the mounting interface, and the plurality of terminals inserted into the passageways. The aligning key comprises a main body, a post, a fixing bar and an indicator bar, the post extending from the main body upwardly and the fixing bar and the indicator bar extending from the main body downwardly, the fixing bar and the indicator bar paralleled to each other.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
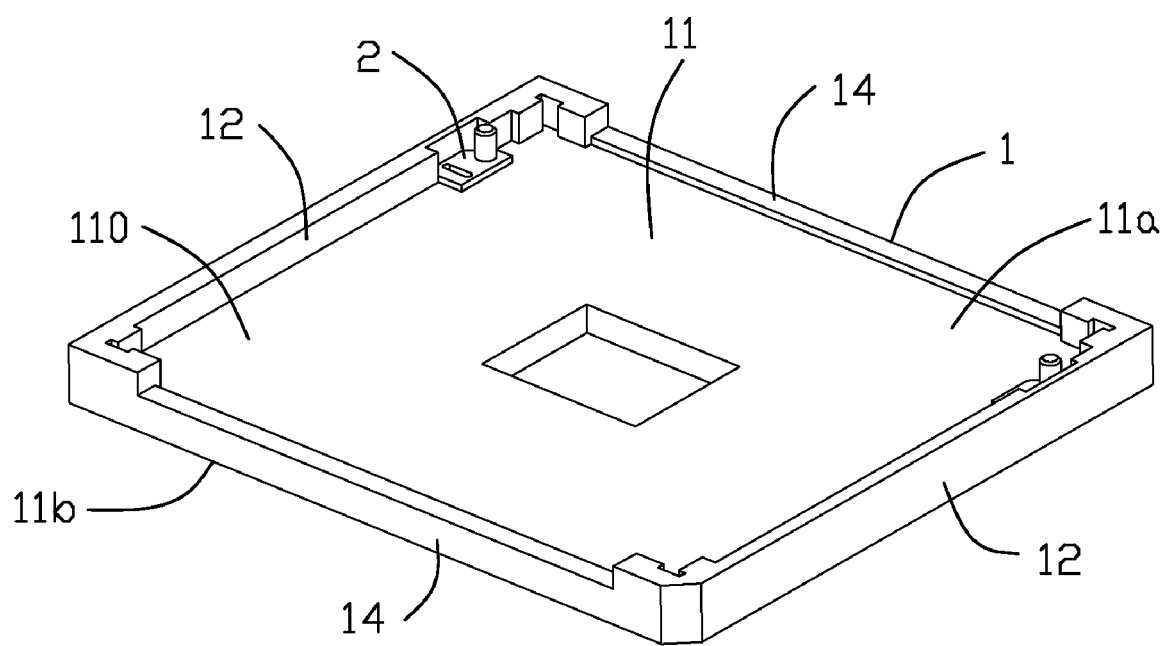
FIG. 1 is a perspective view of an electrical connector in accordance to the present invention.

Referring to FIGS. 1 to 4, an electrical socket connector 100 according to the present invention includes an insulative housing 1 having a general flat base 11 with a mating surface 11a adapted to face a chip package 3, typically a CPU chip, and a mounting surface 11b adapted to face a printed circuit board (not shown). The base 11 further includes a peripheral wall 12, 14 so as to jointly define a receiving space 110 together with the base 11 for receiving the CPU chip 2. A plurality of passageways (not shown) extends from the mating interface 11a toward the mounting interface 11b, with a plurality of terminals (not shown) each inserted into the passageways from the mating interface 11a to the mounting interface 11b. A pair of detachable aligning keys 2 is assembled to the insulative housing 1 by interference fit.

The CPU chip 3 is provided with a pair of notches 30 along opposite sides thereof. The notches 30 generally have a semi-circular shape, and cooperate with the detachable aligning keys 20 to work as an indicator for the CPU chip 3 to be correctly mounted on the electrical connector 100.

Figure 2:
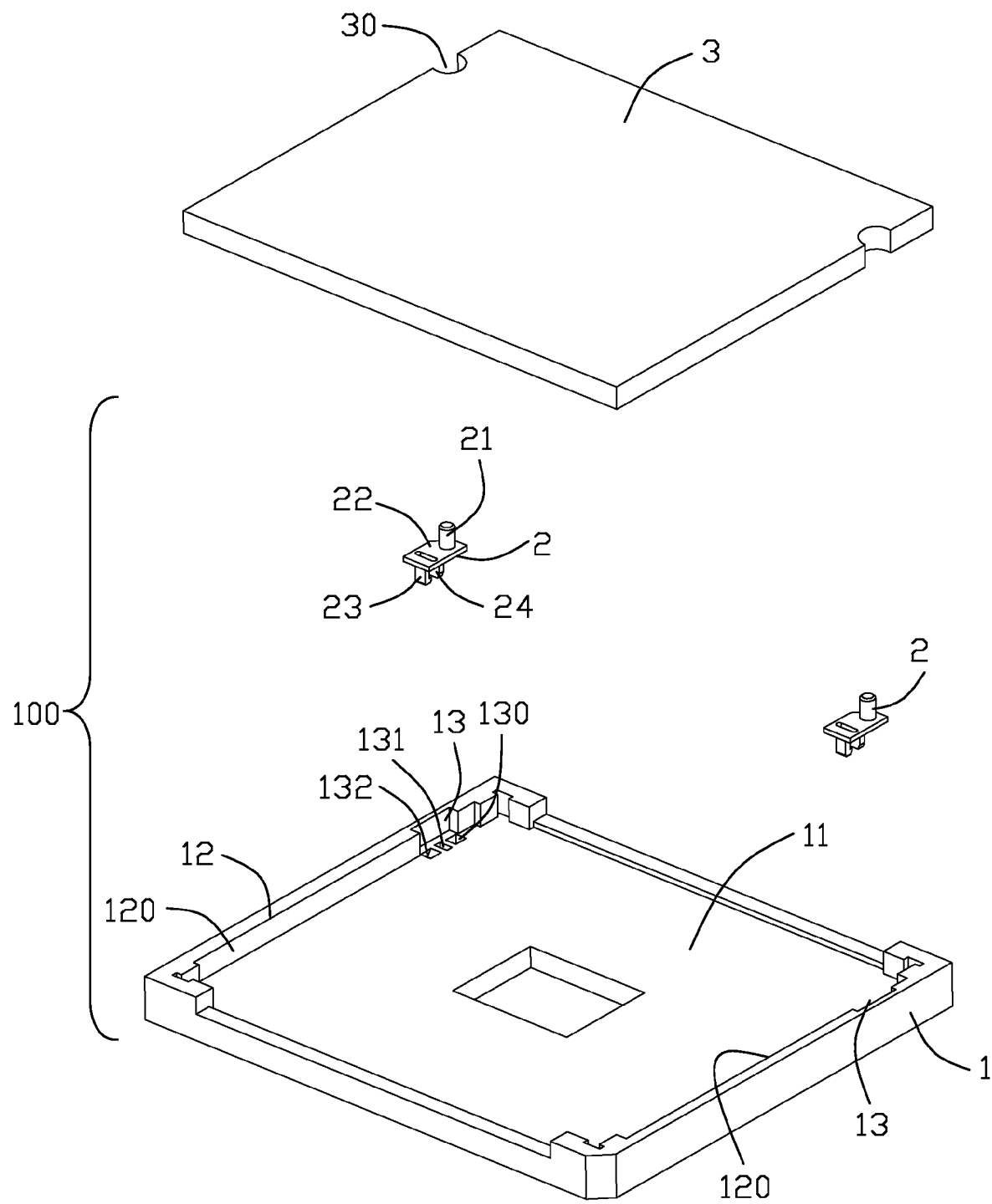
FIG. 2 is an exploded view of FIG. 1.
Figure 3:
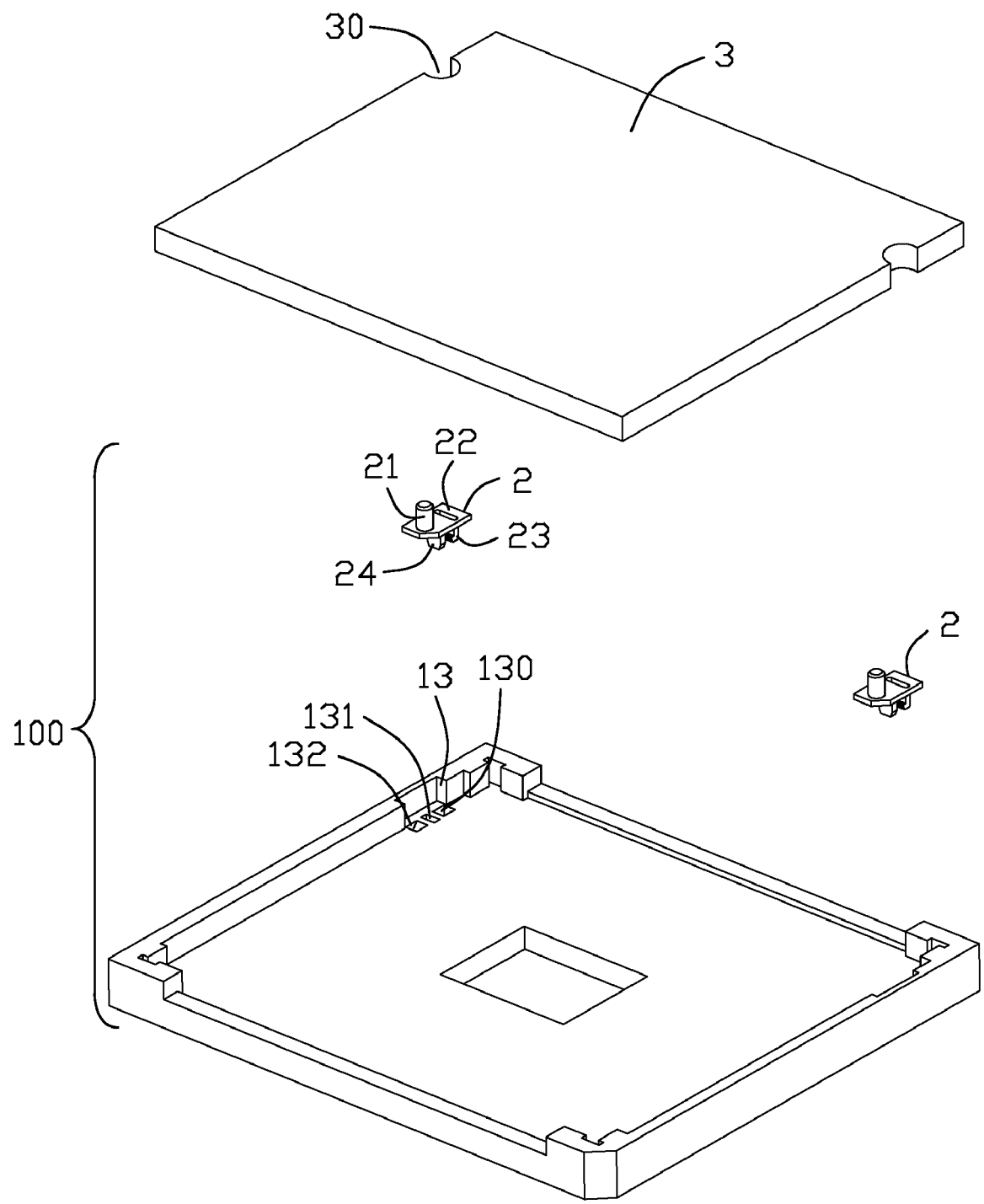
FIG. 3 is an exploded view as the aligning key turned 180 degree in according to the FIG. 2.
Figure 4:
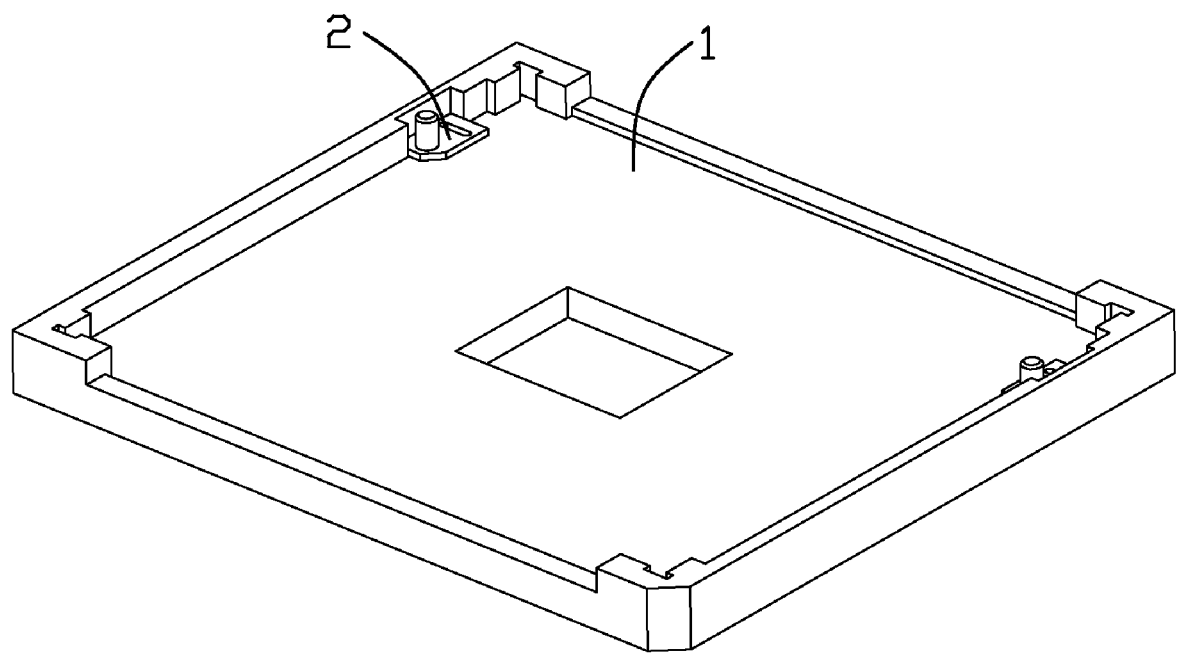
FIG. 4 is a perspective view in according to the FIG. 3.

Referring to FIGS. 2 to 3, the pair of detachable aligning keys 2 is formed individually from the insulative housing 1, and more specifically, the aligning keys 2 are assembled to the opposite sidewalls 102 of the insulative housing 1 with interference fit. Each of the aligning keys 16 is preferably made of plastic material, and includes a main body 22 having a rectangular configuration and a post 21 extending from the main body 22 in a vertical direction. The post 21 has a curved surface that conforms to the shape of the notch 30 of the CPU chip 3 such that the post 21 matches with the notch 30 of the CPU chip 3. The main body 22 further includes a fixing bar 23 and an indicator bar 24. The fixing bar 23 and the indicator bar 24 extend from the main body 22 along the vertical direction toward oppositely and parallel to each other.

The base 11 has opposed sidewalls 102 defining a pair of recessed areas 13 to receive the respective aligning keys 16 therein. The recessed areas 13 have a shape to comply with the aligning keys 2, and each of the recessed areas 13 is composed of first, second and third slots 130, 131, 132 for corresponding to the fixing bar 23 and the indicator bar 24, the first, second and third slots 130, 131, 132 are aligned in a line. When the aligning key 2 is assembling to the recessed area 13, the fixing bar 23 inserts into the first slot 130, and the indicator bar 24 inserts into the second slot 131. The fixing bar 23 engages with the first slot 130, so as to make the aligning key 2 fasten on the recessed area 13. In this situation, the post 21 has a first position, and the electrical connector 100 can receive one type of CPU. Now, turned the aligning key 2 with 180 degrees, the fixing bar 23 inserts into the third slot 132, and the indicator bar 24 inserts into the second slot 131. The post 21 has a second position, and the electrical connector 100 can receive a second type of CPU. That is, the electrical connector 100 can receive two types of CPU as the aligning key 2 is turned.

Understandably, in this preferred embodiment, the aligning key 2 intentionally arranges the positions/dimensions of the post 21 and the fixing bar 23 and the indicator bar 24 so as to perform two different alignment key positions with one same aligning key 2. Alternately, using two different aligning keys 2 with the two differently positioned posts 21 relative to the main body 22 is another choice. Under that situation, one of those slots 130, 131 and 132 may be eliminated.

The recessed area 13 can defines more than three slots, and every two adjacent slots form at least a position of the aligning key 2.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector, comprising:
    an insulative housing having a general flat base with a mating interface adapted to face a chip package, and a mounting interface adapted to face a printed circuit board;
    a peripheral wall extending from edges of the base;
    a plurality of passageways extending from the mating interface toward the mounting interface;
    a plurality of terminals inserted into the passageways; and
    a detachable aligning key assembled to the base, the aligning key comprising a main body, a post, a fixing bar and an indicator bar, the post extending from the main body upwardly and the fixing bar and the indicator bar extending from the main body downwardly, the fixing bar and the indicator bar being parallel to each other;
    wherein the aligning key is capable of assembling to the base after turning 180 degree.

2. The electrical connector as claimed in claim 1, wherein the peripheral wall defines a recessed area to receive the aligning key, and the base defines at least three slots adjacent to the peripheral wall.

3. The electrical connector as claimed in claim 2, wherein the at least three slots are aligned in a line, and the fixing bar and the indicator bar are capable of being received in every two adjacent slots.

4. The electrical connector as claimed in claim 3, wherein the fixing bar interferes with an inner surface of the slot.

5. The electrical connector as claimed in claim 1, wherein the main body of the aligning key has a rectangular configuration, which has a cutout at a corner.

6. The electrical connector as claimed in claim 5, wherein the post is disposed adjacent to the cutout.

7. The electrical connector as claimed in claim 2, wherein the aligning key is assembled to the insulative housing with interference fit.

8. The electrical connector as claimed in claim 7, wherein the main body has a rectangular configuration, and the recessed area has a shape to conform with the aligning key.

9. An electrical connector for coupling to different electron components, comprising:
    an insulative housing defining a base with a plurality of side walls upwardly extending from a periphery thereof to commonly define a receiving cavity therein;
    a single key mounting area formed proximate one of said side walls; and
    a plurality of alignment key elements having lower mounting sections in a common configuration, and upper mating key sections; wherein
    said key elements are mutually exclusively and detachably mounted to the key mounting area to perform differently positioned mating key sections for coupling to said different electronic components, respectively.

10. The electrical connector as claimed in claim 9, wherein said alignment key elements are same with one another with said upper mating key sections same with one another.

11. The electrical connector as claimed in claim 9, wherein said housing defines two said key mounting areas and two of said alignment key elements are respectively mounted to said two key mounting areas, respectively.

12. An electrical connector for coupling to different electron components, comprising:
    an insulative housing defining a base with a plurality of side walls upwardly extending from a periphery thereof to commonly define a receiving cavity therein;
    a single key mounting area formed proximate one of said side walls; and
    a single type key element having a lower mounting section and an upper mating key section; wherein
    said key element is detachably mounted to said key mounting area in selectively different orientations so as to perform different differently positioned mating key sections for coupling to said different electronic components, respectively.

13. The electrical connector as claimed in claim 12, wherein the key element is assembled to different positions in said mounting area with said different orientations.

* * * * *